(12) United States Patent
Lee et al.

(10) Patent No.: US 12,413,234 B2
(45) Date of Patent: Sep. 9, 2025

(54) PHASE LOCKED LOOP CIRCUIT AND SEMICONDUCTOR DEVICE INCLUDING THE SAME

(71) Applicant: Samsung Electronics Co., Ltd., Suwon-si (KR)

(72) Inventors: Kyung Min Lee, Suwon-si (KR); Gyu Sik Kim, Suwon-si (KR); Seung Jin Kim, Suwon-si (KR); Jae Hong Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 82 days.

(21) Appl. No.: 18/466,438

(22) Filed: Sep. 13, 2023

(65) Prior Publication Data

US 2024/0106441 A1     Mar. 28, 2024

(30) Foreign Application Priority Data

Sep. 16, 2022  (KR) .................. 10-2022-0116941
Nov. 4, 2022  (KR) .................. 10-2022-0146248

(51) Int. Cl.
*H03L 7/093* (2006.01)
*G05F 3/26* (2006.01)
*H03L 1/00* (2006.01)
*H03L 7/099* (2006.01)

(52) U.S. Cl.
CPC .............. *H03L 7/093* (2013.01); *G05F 3/262* (2013.01); *H03L 1/00* (2013.01); *H03L 7/0995* (2013.01)

(58) Field of Classification Search
CPC ......... H03L 7/093; H03L 1/10; H03L 7/0995; G05F 3/262
See application file for complete search history.

(56) References Cited

U.S. PATENT DOCUMENTS

| | | | |
|---|---|---|---|
| 5,623,325 A | * | 4/1997 | Manico .................. G03B 17/30 396/515 |
| 6,326,855 B1 | | 12/2001 | Jelinek et al. |
| 6,838,951 B1 | | 1/2005 | Nieri et al. |
| 7,852,144 B1 | | 12/2010 | Zonte et al. |

(Continued)

FOREIGN PATENT DOCUMENTS

| | | |
|---|---|---|
| KR | 100481195 B1 | 4/2005 |
| KR | 100655454 B1 | 12/2006 |

*Primary Examiner* — Freshteh N Aghdam
(74) *Attorney, Agent, or Firm* — Harness, Dickey & Pierce, P.L.C.

(57) ABSTRACT

A phase locked loop circuit and a semiconductor device are provided. The phased locked loop circuit includes a reference current generator configured to generate a summed compensation current in which at least one of a process change, a temperature change or a power supply voltage change are compensated and output the summed compensation current as a reference current, a current digital-to-analog converter configured to convert the reference current into a control current in accordance with a digital code and a voltage control oscillator configured to generate a signal based on the control current, wherein the summed compensation current is based on weighted-averaging a first type compensation current and a second type compensation current in response to at least one of the process change, the temperature change or the power supply voltage change.

20 Claims, 6 Drawing Sheets

(56) References Cited

U.S. PATENT DOCUMENTS

| | | | |
|---|---|---|---|
| 8,203,393 B1 | 6/2012 | Leon | |
| 8,432,200 B1 * | 4/2013 | Thakur | H03L 7/0893 |
| | | | 327/147 |
| 9,793,906 B1 * | 10/2017 | Midha | H03L 7/083 |
| 2007/0159262 A1 * | 7/2007 | Quan | H03L 7/107 |
| | | | 331/16 |
| 2008/0074200 A1 * | 3/2008 | Cong | H03L 7/0995 |
| | | | 331/16 |
| 2009/0051342 A1 | 2/2009 | Peng et al. | |
| 2017/0255220 A1 | 9/2017 | Sivakumar et al. | |

* cited by examiner

PHASE LOCKED LOOP CIRCUIT AND SEMICONDUCTOR DEVICE INCLUDING THE SAME

CROSS-REFERENCE TO RELATED APPLICATION

This application claims priority from Korean Patent Application No. 10-2022-0116941 filed on Sep. 16, 2022 and No. 10-2022-0146248 filed on Nov. 4, 2022 in the Korean Intellectual Property Office and all the benefits accruing therefrom under 35 U.S.C. 119, the contents of which in its entirety are herein incorporated by reference.

TECHNICAL FIELD

The present disclosure relates to phase locked loop circuits and semiconductor devices including the same.

DESCRIPTION OF THE RELATED ART

A system on chip (SOC) may use different frequency bands for each embedded component. The SOC includes a plurality of phase locked loop (PLL) circuits to support various frequency bands. The PLL circuit performs data transmission with external devices by using an internal clock signal locked in synchronization with an external clock signal input from an external device in a synchronous semiconductor device. That is, a time synchronization between a reference clock signal and data is very important for stable data transmission between the synchronous semiconductor device and the external device.

In order to implement a PLL circuit of low noise and low power, a ring shaped voltage control oscillator is used, but a problem occurs in that the ring oscillator is a circuit vulnerable to external changes (PVT variation and supply voltage noise). In this respect, it is urgently required to clarify a cause of the problem and solve the problem.

SUMMARY

An object of the present disclosure is to provide phase locked loop circuits and semiconductor devices including the same, in which device performance and reliability are improved even in case of PVT variation.

Another object of the present disclosure is to provide phase locked loop circuits and semiconductor devices including the same, in which device reliability is improved and an area occupied by the device is reduced.

Some example embodiments of the present disclosure provide a phased locked loop circuit including a reference current generator configured to generate a summed compensation current in which at least one of a process change, a temperature change or a power supply voltage change are compensated and output the summed compensation current as a reference current, a current digital-to-analog converter configured to convert the reference current into a control current in accordance with a digital code and a voltage control oscillator configured to generate a signal based on the control current, wherein the summed compensation current is based on weighted-averaging a first type compensation current and a second type compensation current in response to at least one of the process change, the temperature change or the power supply voltage change.

Some example embodiments of the present disclosure provide a phase locked loop circuit including a pair of band gap reference circuits configured to generate a first type compensation current and a second type compensation current based on a change of at least one of a process, a voltage or a temperature, a weighted current mirror configured to generate a summed compensation current by weighted-averaging the first type compensation current and the second type compensation current in response to the change of at least one of the process, the voltage or the temperature, a current mirror configured to generate a reference current from the summed compensation current, a current analog-to-digital converter configured to generate a control current from the reference current in accordance with a digital code and a voltage control oscillator configured to generate a signal in accordance with the control current.

Some example embodiments of the present disclosure provide a semiconductor device including a first type band gap reference circuit configured to generate a first type compensation current based on a change of at least one of a process, a voltage or a temperature, a second type band gap reference circuit having a twin structure with the first type band gap reference circuit and configured to generate a second type compensation current based on the change of at least one of the process, the voltage or temperature, a plurality of first compensation transistors in which at least one is configured to output a weighted first type compensation current in response to the change of at least one of the process, the voltage or the temperature and a plurality of second compensation transistors in which at least one is configured to output a weighted second type compensation current in response to the change of at least one of the process, the voltage or the temperature, and wherein the semiconductor device is configured to generate a summed compensation current obtained by weighted-averaging the first type compensation current and the second type compensation current through a common node of the plurality of first compensation transistors and the plurality of second compensation transistors.

DETAILED DESCRIPTION OF THE DISCLOSURE

Hereinafter, a first type and a second type are intended to refer to different doping types. In the following description of the example embodiments, it is assumed that the first type and the second type are a P type and an N type, respectively, in implementation of a semiconductor device, but the example embodiments of the present disclosure are not limited thereto. The first type and the second type may be implemented as an N type and a P type, respectively.

Figure 1:
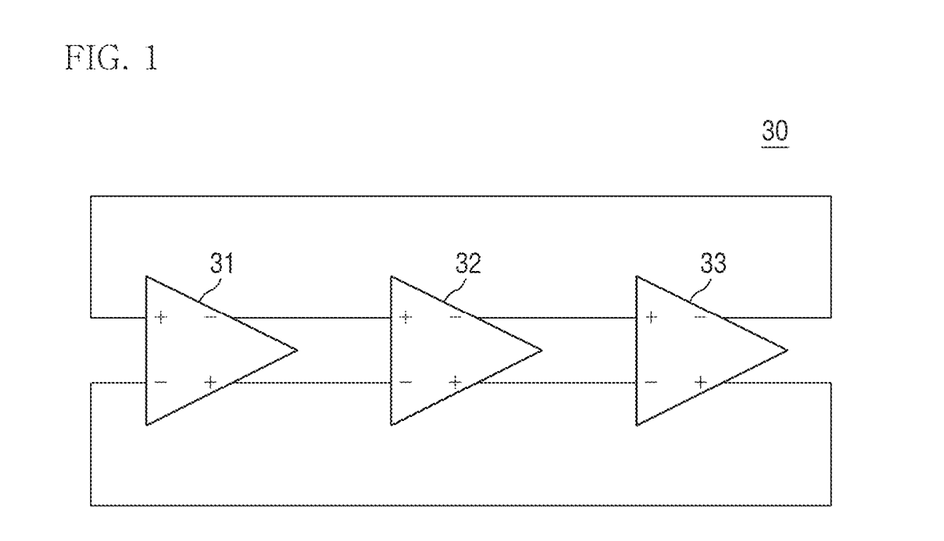
FIG. 1 illustrates a three-stage ring oscillator.
Figure 2:
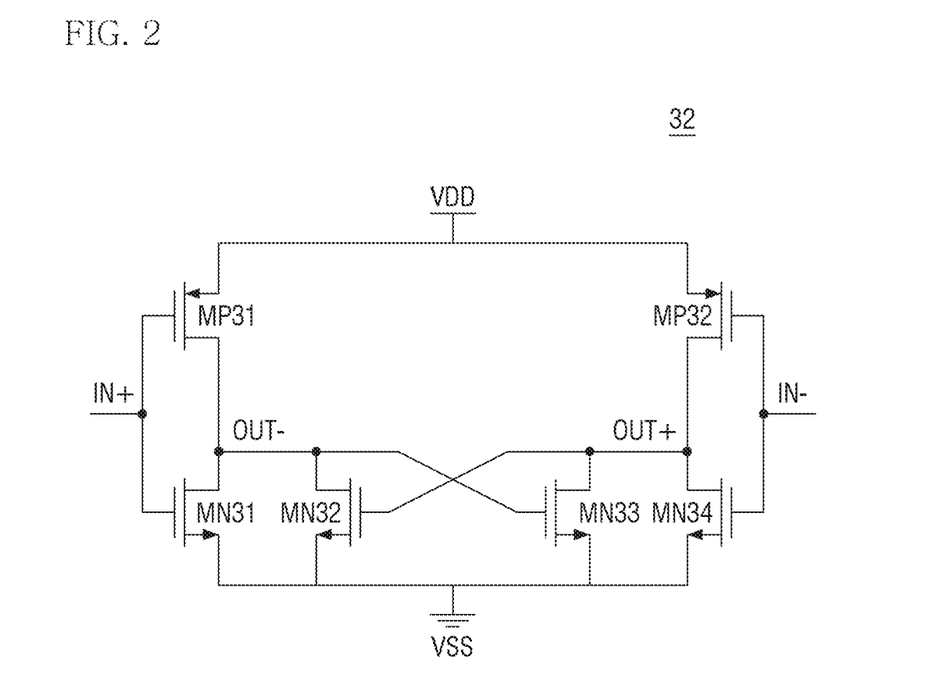
FIG. 2 is a detailed circuit diagram illustrating a delay cell of FIG. 1.

FIG. 1 illustrates a three-stage ring oscillator, and FIG. 2 is a detailed circuit diagram illustrating a delay cell of FIG. 1.

Referring to FIGS. 1 and 2, a three-stage ring oscillator 30 (which may also be referred to as a voltage control oscillator (VCO)) includes three delay cells 31, 32 and 33. To further remove common mode noise, a signal path between the delay cells may be implemented as a differential path.

The delay cell (e.g., delay cell 32) includes an NMOS transistor and a PMOS transistor. For example, the delay cell may include a pair of PMOS transistors MP31 and MP32 for receiving an input voltage and outputting an output voltage, a pair of NMOS transistors MN31 and MN34, and a pair of NMOS transistors MN32 and MN33 coupled by cross-coupling. The pair of PMOS transistors MP31 and MP32 and the pair of NMOS transistors MN31 and MN34 receive differential input voltages IN+ and IN− in gates and output differential output voltages OUT− and OUT+ to common drain nodes MP31-MN31 and MP32-MN34 of the PMOS transistor and the NMOS transistor. A source-drain of each of the pair of NMOS transistors MN32 and MN33 coupled by cross-coupling is connected to the same source-drain as that of the pair of NMOS transistors MN31 and MN34, and a differential output voltage is provided to the gate of each of the pair of NMOS transistors MN32 and MN33.

The differential output signals OUT+ and OUT− may be generated as a pair of sinusoidal signals, and the output signal OUT+ may have a phase difference of 1800 from the output signal OUT−. Afterwards, when the differential output signal is converted to a single ended signal, any common mode noise injected into an input terminal or a power supply terminal may be canceled.

According to some example embodiments, the delay cell 32 may adjust a frequency based on transconductance and load capacitance of the pair of PMOS transistors MP31 and MP32 and the pair of NMOS transistors MN31 and MN34. In this case, the transconductance of the pair of PMOS transistors MP31 and MP32 and the pair of NMOS transistors MN31 and MN34 may be adjusted through a reference current, and the PMOS transistors and the NMOS transistors may have a wide frequency adjustment band in accordance with the adjusted transconductance.

Figure 3:
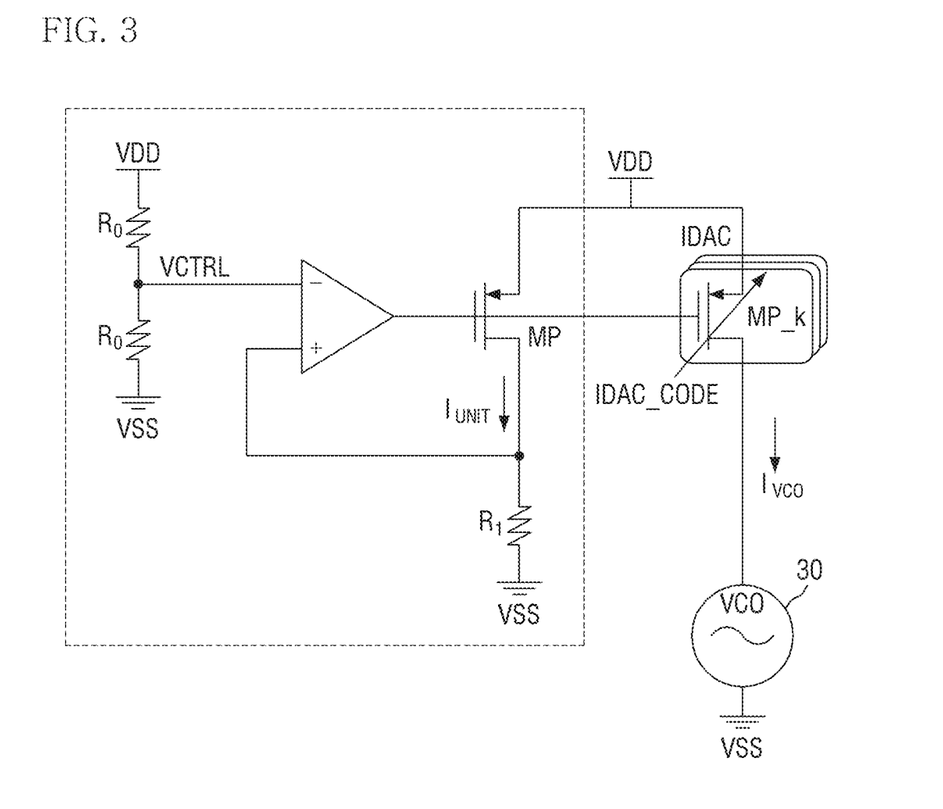
FIG. 3 illustrates a phase locked loop (PLL) circuit including a ring oscillator.

FIG. 3 illustrates a phase locked loop (PLL) circuit including a ring oscillator.

Referring to FIG. 3, the PLL circuit includes a current digital-to-analog converter IDAC and a VCO 30.

The current digital-to-analog converter IDAC adjusts transconductance $g_m$ of a PMOS transistor MP_k based on a digital code IDAC_CODE. For example, the digital code IDAC_CODE turns on or off a plurality of the current digital-to-analog converters IDAC 20 so that a reference current corresponding to the number of the turned-on the current digital-to-analog converters IDAC is provided to the VCO 30. In detail, the current digital-to-analog converter IDAC 20 generates a VCO input current $I_{VCO}$ adjusted by the digital code IDAC_CODE based on a reference current $I_{UNIT}$.

The reference current $I_{UNIT}$ is generated by a reference current generator that includes an amplifier and a PMOS transistor MP, and a plurality of resistors $R_0$ and $R_1$. The resistor $R_0$ is a distributed resistor, and a control voltage VCTRL-VDD/2 is provided to an input terminal (−) of the amplifier, and a feedback voltage $V=I_{UNIT} R_1$ connected to a drain terminal of the PMOS transistor and based on the reference current $I_{UNIT}$ is provided to an input terminal (+) of the amplifier.

The PMOS transistor MP receives an output voltage of the amplifier through a gate terminal to generate the reference current $I_{UNIT}$ based on a power supply voltage VDD and an amplifier output voltage.

In detail, the reference current $I_{UNIT}$ may be calculated as expressed in Equation 1.

$$I_{UNIT} = \frac{VCTRL}{R_1} = \frac{VDD}{2R_1} \qquad \text{<Equation 1>}$$

Referring to the Equation 1, the reference current $I_{UNIT}$ is a value obtained by dividing the control voltage VCTRL by a resistance $R_1$ of a regulation loop, which is calculated as a voltage obtained by dividing a half of the power supply voltage VDD by the resistor $R_1$. Since the plurality of current digital-to-analog converters IDAC are connected to the VCO 30, the VCO input current $I_{VCO}$ supplied to the VCO 30 is calculated by multiplying the reference current $I_{UNIT}$ by the digital code IDAC_CODE.

However, since transistors are greatly affected by process distribution and the reference current $I_{UNIT}$ for determining transconductance is determined by the power supply voltage VDD as expressed in the Equation 1, a frequency deviation may occur due to the power supply voltage VDD. The resistor $R_1$ of the regulation loop may vary sensitively to a temperature change due to a temperature coefficient and a threshold voltage of the PMOS transistor.

Since a PLL circuit 1 is sensitive to changes of a process, a power supply voltage and a temperature, a dynamic range of the current digital-to-analog converter IDAC 20 is increased depending on such changes, so that a signal of a wide frequency band should be generated under various conditions. The dynamic range of the current digital-to-analog converter IDAC 20 will be described later in detail with reference to FIG. 4.

Figure 4:
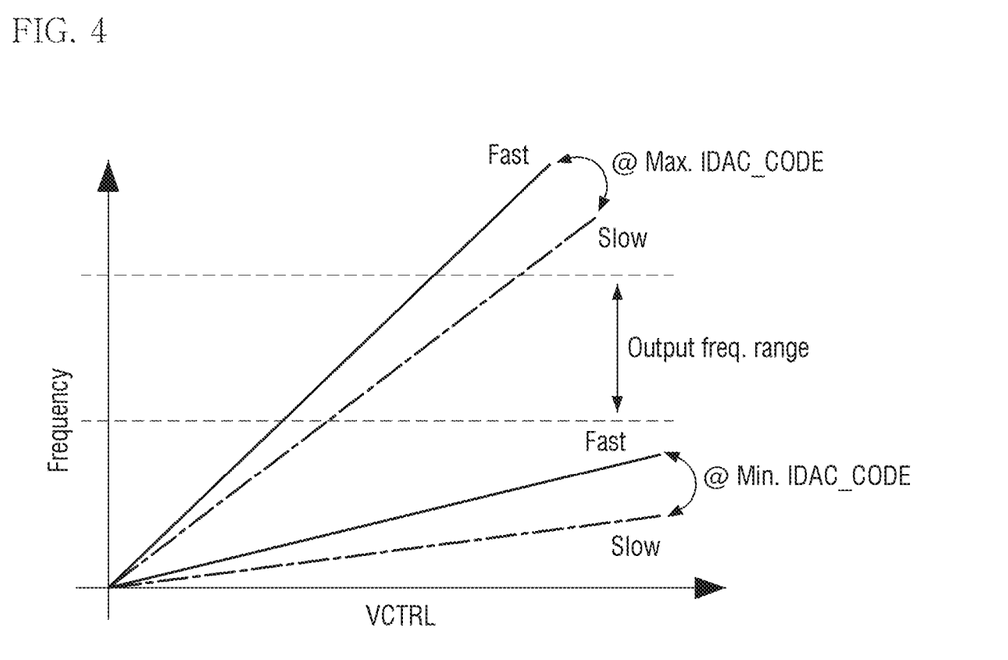
FIG. 4 is a graph illustrating a frequency change versus a control voltage according to IDAC_CODE.

FIG. 4 is a graph illustrating a frequency change versus a control voltage according to IDAC_CODE.

In order that the PLL circuit 1 operates constantly even in case of various processes, power supply voltages and temperature change (PVT variation, the dynamic range of the current digital-to-analog converter IDAC 20 should be increased. The dynamic range of the current digital-to-analog converter IDAC 20 is determined in accordance with a bit width of the IDAC_CODE that is a digital signal.

Referring to FIG. 4, the PLL circuit should make sure of a predefined (or, alternatively, desired) high frequency band or low frequency band.

In case of the predefined (or, alternatively, desired) high frequency, the PLL circuit of IDAC_CODE (Max. IDAC_CODE), which has a preset maximum bit width, should be able to implement a high frequency in which a slope of a slow condition is predefined (or, alternatively, desired). Also, in case of the predefined (or, alternatively, desired) low frequency, the PLL circuit of IDAC_CODE (Min. IDAC_CODE), which has a predetermined (or, alternatively, set or desired) minimum bit width, should be able to implement a low frequency in which a slope of a fast condition is predefined (or, alternatively, desired).

That is, the dynamic range of the IDAC_CODE of the PLL circuit itself may be regarded between a slope of Min. IDAC_CODE of the fast condition and a slope of Max. IDAC_CODE of the slow condition and a slope of Max.

IDAC_CODE of the slow condition (output frequency range). In order that the PLL circuit reliably operates depending on the PVT variation, the bit width of the IDAC_CODE should be expanded to more widen (e.g., open) the output frequency range.

Since the bit width of the IDAC_CODE is based on the current digital-to-analog converter IDAC 20, when the number of the current digital-to-analog converters IDAC 20 is increased, an area of the PLL circuit itself may be increased, whereby the PLL circuit which has an appropriate number of current digital-to-analog converters IDAC 20 and operates reliably even in case of PVT variation should be implemented.

Figure 5:
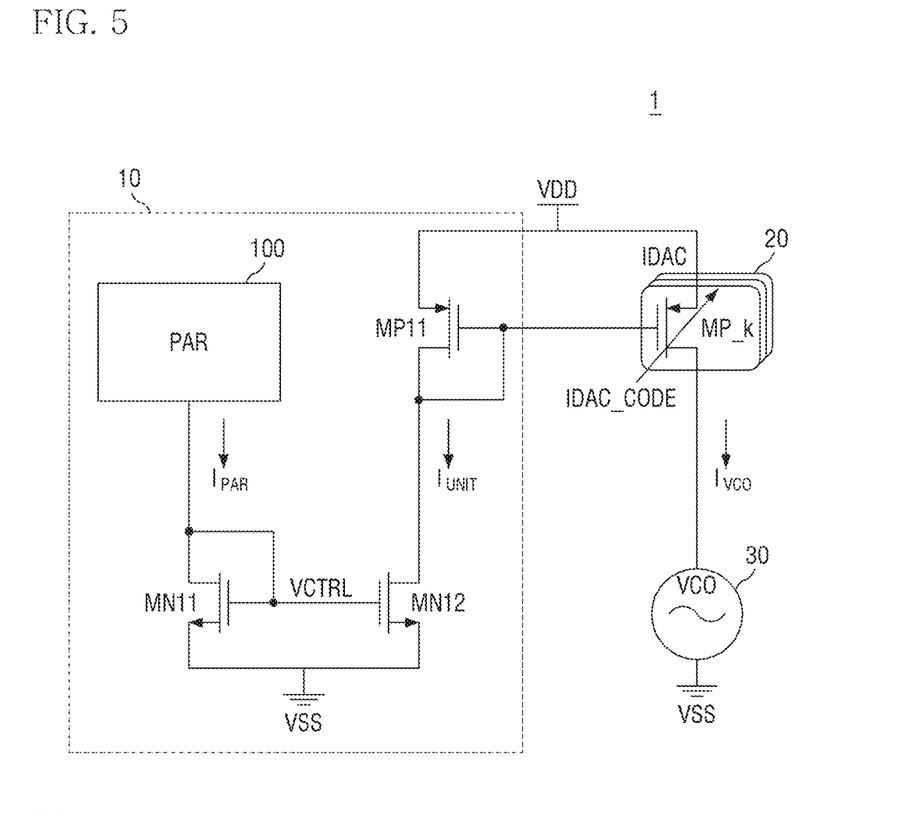
FIG. 5 is a circuit diagram illustrating a PLL circuit 1 according to some example embodiments.

FIG. 5 is a circuit diagram illustrating a PLL circuit 1 according to some example embodiments.

Referring to FIG. 5, the PLL circuit 1 includes a reference current generator 10, a current digital-to-analog converter IDAC 20 and a voltage control oscillator VCO 30. In some example embodiments, the reference current generator 10 includes a process aware reference (PAR) circuit 100, a pair of NMOS transistors MN11 and MN12 forming a first current mirror, and a PMOS transistor MP11 for forming the IDAC 20 and a second current mirror.

A drain terminal of the NMOS transistor MN11 is connected to the PAR circuit 100, and its gate and drain terminal are electrically connected to each other. A drain terminal of the NMOS transistor MN12 is connected to a drain terminal of the PMOS transistor MP11, and a gate of the NMOS transistor MN12 is connected to the gate of the NMOS transistor MN11 and electrically connected to the drain terminal of the NMOS transistor MN11. The connected drain terminals of the NMOS transistors MN11 and MN12 are further connected to power ground terminal VSS.

That is, a first current mirror, which includes the pair of NMOS transistors MN11 and MN12, generates a gate control voltage VCTRL of the pair of NMOS transistors MN11 and MN12 in accordance with a compensation current $I_{PAR}$ of the PAR circuit 100 and generates a reference current $I_{UNIT}$ based on the compensation current $I_{PAR}$ of the PAR circuit 100.

The gate of the PMOS transistor MP11 is commonly connected to a gate of the PMOS transistor MP_k included in the IDAC 20, and the gate of the PMOS transistor MP11 is electrically connected to the drain terminal of the PMOS transistor MP11.

The PLL circuit 1 according to some example embodiments may generate the gate control voltage VCTRL and the reference current $I_{UNIT}$ based on the compensation current $I_{PAR}$ of the PAR circuit 100, thereby compensating for a process distribution change, a power supply voltage change and/or a temperature change of a transistor constituting the circuit.

Figure 6:
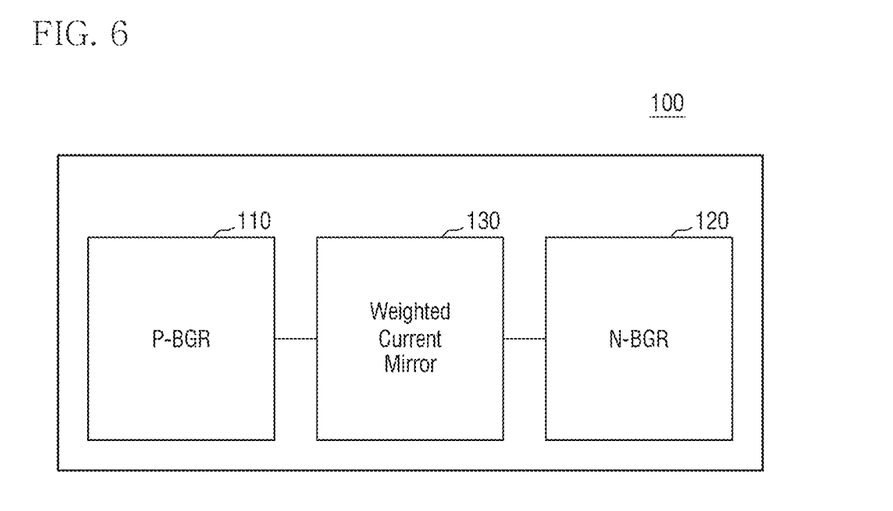
FIG. 6 is a block diagram illustrating a PAR circuit 100 according to some example embodiments.
Figure 7:
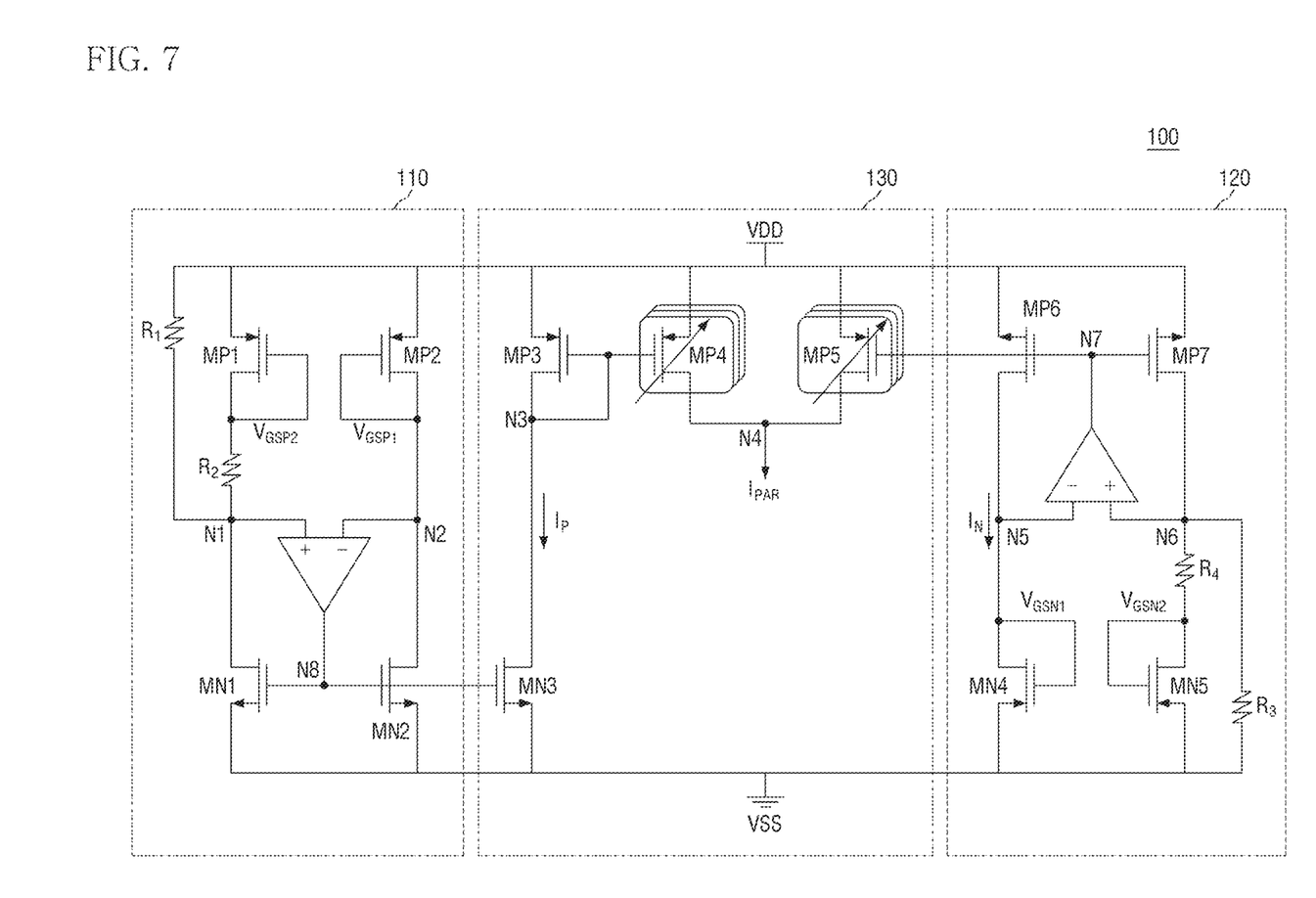
FIG. 7 is a detailed circuit diagram illustrating a PAR circuit 100 according to some example embodiments.

FIG. 6 is a block diagram illustrating a PAR circuit 100 according to some example embodiments, and FIG. 7 is a detailed circuit diagram illustrating a PAR circuit 100 according to some example embodiments.

Referring to FIGS. 6 and 7, the PAR circuit 100 may include a pair of band gap reference circuits and a weighted current mirror 130.

The pair of band gap reference circuits include a first type band gap reference circuit 110 and a second type band gap reference circuit 120, which are respectively connected to both ends of the weighted current mirror 130. The first type band gap reference circuit 110 may also be referred to as the P-BGR 110, and the second type band gap reference circuit 120 may also be referred to as the N-BGR 120.

According to some example embodiments, the first type band gap reference circuit 110 and the second type band gap reference circuit 120 may have a twin structure. That is, the first type band gap reference circuit 110 and the second type band gap reference circuit 120 are different from each other in that they are implemented as a PMOS transistor circuit or an NMOS transistor, but may be implemented in the same circuit connection structure.

For example, the first type band gap reference circuit 110 includes an amplifier, a pair of PMOS transistors MP1 and MP2, a pair of NMOS transistors MN1 and MN2, and resistors $R_1$ and $R_2$.

The pair of PMOS transistors MP1 and MP2 are connected between a power supply terminal VDD and a node N1 and between the power supply terminal VDD and a node N2, respectively. The PMOS transistors MP1 and MP2 have a source terminal connected to the power supply terminal VDD and a drain terminal connected to a gate terminal to form a diode connection. The PMOS transistor MP1 has a gate-source voltage $V_{GSP2}$ applied to the gate, and the PMOS transistor MP2 has a gate-source voltage $V_{GSP1}$ applied to the gate.

The PMOS transistor MP1 is connected between the power supply terminal VDD and a first terminal (+) of the amplifier, and the PMOS transistor MP2 is connected between the power supply terminal VDD and a second terminal (−) of the amplifier. The resistor $R_2$ is connected between the PMOS transistor MP1 and the node N1, and the resistor $R_1$ is connected in parallel with the PMOS transistor MP1, that is, between the power supply terminal VDD and the node N1.

The pair of NMOS transistors MN1 and MN2 are connected between the node N1 and a power ground terminal VSS and between the node N2 and the power ground terminal VSS, respectively. A gate terminal of the NMOS transistors MN1 and MN2 is connected to an output node N8 of the amplifier.

When the PMOS transistor MP2 of the first type band gap reference circuit 110 operates in a sub-threshold area, a current $I_{DS}$ flowing to the PMOS transistor MP2 is calculated as expressed in Equation 2.

$$I_{DS} = \mu C_{ox} \frac{W}{L}(\eta - 1)V_T^2 \exp\left(\frac{V_{GSP1}-V_{th}}{\eta V_T}\right) \qquad \text{<Equation 2>}$$

In the above Equation, $V_{GSP1}$ means a gate-source voltage of the transistor MP2, Vth means a threshold voltage of the transistor MP2, f means a sub-threshold slope factor of the transistor MP2, T means an absolute temperature, and $V_T$ means a thermal voltage kT/q proportional to the absolute temperature T.

The current $I_{DS}$ is greatly affected by the thermal voltage $V_T$ according to an operation temperature at a denominator of an exponential function. The diode-connected PMOS transistor MP2 may have a voltage $V_{GSP1}$ having a negative coefficient in a temperature-voltage relation, and a current having a proportional relation with the voltage may be a complementary to absolute temperature (CTAT) current having a negative coefficient relative to the temperature. That is, the CTAT current may be calculated as $I_{CTATP}$ $V_{GSP1}/R_1$ in $R_1$.

The PMOS transistor MP1 may have a size different from that of the PMOS transistor MP2. The PMOS transistor MP1 may have a size difference of n times from the PMOS transistor MP2. When the PMOS transistor MP1 and the PMOS transistor MP2 have their respective sizes different from each other, temperature characteristics vary, so that proportional to absolute temperature (PTAT) characteristics may be formed based on a voltage difference between the two transistors. The PTAT current based on the size difference between the two transistors MP1 and MP2 is proportional to the absolute temperature T as expressed in Equation 3.

$$\Delta V_{GSP} = \qquad \text{<Equation 3>}$$
$$V_{GSP2} - V_{GSP1} = V_T \ln\frac{nI_{DS2}}{I_{02}} - V_T \ln\frac{I_{DS1}}{I_{01}} = V_T \ln n = \frac{kT}{q}\ln n$$

In the Equation 3, $V_{GSP2}$ is a gate-source voltage of the PMOS transistor MP1, $V_{GSP1}$ is a gate-source voltage of the PMOS transistor MP2, $I_{DS2}$ is a drain-source current of the PMOS transistor MP1, and $I_{DS1}$ is a drain-source current of the PMOS transistor MP2. Also, n is a size ratio of the PMOS transistor MP1 to the PMOS transistor MP2, and T is the absolute temperature.

In the shown example, the PMOS transistor MP1 will be described as having a size of eight times of the PMOS transistor MP2. That is, $V_{GSP2}$ has a gate-to-source voltage that is eight times greater than $V_{GSP1}$, but example embodiments of the present disclosure are not limited thereto. The size difference between the two transistors may be variously set depending on various example embodiments.

That is, according to the Equation 3, since a body-effect influence between the two transistors MP1 and MP2 is insignificant, when it is assumed that the threshold voltage Vth is almost the same between the two transistors MP1 and MP2, $\Delta V_{GSP}$ is proportional to the absolute temperature T. The transistors MP1 and MP2 generate a PTAT current $I_{PTATP}=\Delta V_{GSP}/R_2$) based on the resistor $R_2$ and $\Delta V_{GSP}$, and the PTAT current $I_{PTATP}$ is proportional to the absolute temperature T.

Based on these characteristics, the first type band gap reference circuit 110 may generate a first type compensation current $I_P$. The first type compensation current $I_P$ is calculated as expressed in Equation 4.

$$I_P = \frac{V_{GSP1}}{R_1} + \frac{\Delta V_{GSP2}}{R_2} = \frac{1}{R_1}\left(V_{GSP1} + \frac{R_1}{R_2}\Delta V_{GSP}\right) \qquad \text{<Equation 4>}$$

That is, the first type compensation current $I_P$ is a value obtained by adding a CTAT current $I_{CTATP}$ inversely proportional to the absolute temperature and a PTAT current $I_{PTATP}$ proportional to the absolute temperature to each other, and a constant current may be output without a temperature deviation by adjusting a ratio of the resistor $R_1$ and the resistor $R_2$.

The second type band gap reference circuit 120 includes an amplifier, a pair of NMOS transistors MN4 and MN5, a pair of PMOS transistors MP6 and MP7, and resistors $R_3$ and $R_4$.

The pair of NMOS transistors MN4 and MN5 are respectively connected between the power ground terminal VSS and a node N5 and between the power ground terminal VSS and a node N6. The pair of NMOS transistors MN4 and MN5 have a source terminal connected to the power ground terminal VSS, and a drain terminal connected to a gate terminal to form a diode connection. The NMOS transistor MN4 has a gate-source voltage $V_{GSN1}$ applied to a gate, and the NMOS transistor MN5 has a gate-source voltage $V_{GSN2}$ applied to the gate.

The NMOS transistor MN5 is connected between the power ground terminal VSS and a first terminal (+) of the amplifier, and the NMOS transistor MN4 is connected between the power ground terminal VSS and a second terminal (−) of the amplifier. The resistor $R_4$ is connected between the NMOS transistor MN5 and the node N6, and the resistor $R_3$ is connected in parallel with the NMOS transistor MN5, that is, between the power ground terminal VSS and the node N6.

The pair of PMOS transistors MP6 and MP7 are connected between the node N5 and the power supply terminal VDD and between the node N6 and the power supply terminal VDD, respectively. A gate terminal of the pair of PMOS transistors MP6 and MP7 is connected to the output node N8 of the amplifier.

When the NMOS transistor MN4 of the second type band gap reference circuit 120 operates in the sub-threshold area, the current $I_{DS}$ flowing to the NMOS transistor MN 4 is calculated as expressed in Equation 5.

$$I_{DS\_MN4} = \mu C_{ox}\frac{W}{L}(\eta - 1)V_T^2 \exp\left(\frac{V_{GSN1}-V_{th}}{\eta V_T}\right) \qquad \text{<Equation 5>}$$

In the above equation, $V_{GSN1}$ means a gate-source voltage of the transistor MN4, Vth means a threshold voltage of the transistor MN4, η means a sub-threshold slope factor of the transistor MN4, T means an absolute temperature, and $V_T$ means a thermal voltage kT/q proportional to the absolute temperature T.

The diode-connected NMOS transistor MN4 may have a voltage $V_{GSN1}$ having a negative coefficient in a temperature-voltage relation, and a CTAT current $I_{CTAT\_N} V_{GSN1}/R_3$ may flow to the resistor $R_3$ in accordance with the voltage $V_{GSN1}$ due to parallel connection.

Also, the NMOS transistor MN4 may have a size different from that of the NMOS transistor MN5. The NMOS transistor MN4 may have a size difference of n times from the NMOS transistor MN5. When the NMOS transistor MN4 and the NMOS transistor MN5 have their respective sizes different from each other, temperature characteristics vary, so that proportional to absolute temperature (PTAT) characteristics may be formed based on a voltage difference between the two transistors. The PTAT current based on the size difference between the two transistors MN4 and MN5 is proportional to the absolute temperature T as expressed in Equation 6.

$$\Delta V_{GSN} = \qquad \text{<Equation 6>}$$
$$V_{GSN2} - V_{GSN1} = V_T \ln\frac{nI_{DS5}}{I_{02}} - V_T \ln\frac{I_{DS4}}{I_{01}} = V_T \ln n = \frac{kT}{q}\ln n$$

In the Equation 6, $V_{GSN2}$ is a gate-source voltage of the NMOS transistor MN4, $V_{GSN1}$ is a gate-source voltage of the NMOS transistor MN5, $I_{DS5}$ is a drain-source current of the NMOS transistor MP5, and $I_{DS4}$ is a drain-source current of the NMOS transistor MN4. Also, n is a size ratio of the NMOS transistor MP5 to the NMOS transistor MN4, and T is the absolute temperature.

$\Delta V_{GSN}$ is proportional to the absolute temperature T. The transistors MN4 and MN5 generate a PTAT current $I_{GSTN}=V_{GSN}/R_4$ based on the resistor $R_4$ and $\Delta V_{GSN}$, and the PTAT current $I_{PTATN}$ is proportional to the absolute temperature T.

As described in the first type band gap reference circuit 110, the second type band gap reference circuit 120 may generate a second type compensation current $I_N$ by adding the PTAT current and the CTAT current to each other as expressed in Equation 7.

$$I_N = \frac{V_{GSN1}}{R_3} + \frac{\Delta V_{GSN}}{R_4} = \frac{1}{R_3}\left(V_{GSP1} + \frac{R_3}{R_4}\Delta V_{GSN}\right) \quad \text{<Equation 7>}$$

According to the Equation 7, the second type band gap reference circuit 120 may output a constant current without any temperature deviation by adjusting the ratio of the resistor $R_3$ and the resistor $R_4$.

The weighted current mirror 130 may include a transistor MP3 and a transistor MN3, which are diode-connected to convert a first type compensation current $I_P$ generated at the N2 node by the first type band gap reference circuit 110.

The first band gap reference circuit 110 generates the first type compensation current flowing in a direction from the transistor MN 2 to the transistor MP2 at a node N2, whereas the weighted current mirror 130 may further include auxiliary current mirror circuits MP3 and MN3 to weighted-average with the second type compensation current, thereby reversing a current direction.

The weighted current mirror 130 generates a summed compensation current obtained by weighted-averaging the first type compensation current $I_P$ and the second type compensation current $I_N$. The weighted current mirror 130 generates and outputs a summed compensation current $I_{PAR}$ as expressed in Equation 8.

$$I_{PAR}=aI_P+(1-a)I_N \quad \text{<Equation 8>}$$

The PLL circuit (e.g., the PLL circuit 1 of FIG. 5) may include at least one PMOS transistor and at least one NMOS transistor, which may be affected by both a PMOS transistor process and an NMOS transistor process. Even though the PLL circuit is affected by the two processes, the PAR circuit 100 may compensate for the frequency deviation according to the process by adjusting the influence of the NMOS transistor process through a weight value 'a' of the first type compensation current $I_P$ generated in the first type band gap reference circuit 110 and adjusting the influence of the NMOS transistor process through a weight value '1-a' of the second type compensation current $I_N$ generated in the second type band gap reference circuit 120.

The weighted current mirror 130 may further include a plurality of compensation transistor pairs for weighted-averaging and outputting the first type compensation current and the second type compensation current.

According to some example embodiments, the weighted current mirror 130 may further include a plurality of compensation PMOS transistor pairs. The plurality of compensation PMOS transistor pairs are connected between the power supply terminal and a summed output node N4 and their gates are respective connected to the band gap reference circuit. The weighted-average summed compensation current is output through the summed output node N4. For example, the weighted current mirror 130 may further include a plurality of compensation PMOS transistors MP4 electrically connected to the first type band gap reference circuit 110 and a plurality of compensation PMOS transistors MP5 electrically connected to the second type band gap reference circuit 120.

To reflect the weight value, the compensation transistor MP4 and the compensation transistor MP5 may have the same size. The weighted current mirror 130 may adjust a weight value 'a: (1–a)' by varying the number of turned-on or turned-off compensation transistors MP4 and MP5 in accordance with some example embodiments.

Alternatively, although not shown, the weighted current mirror 130 may further include a plurality of compensation NMOS transistor pairs in accordance with some example embodiments. The pair of compensation NMOS transistor pairs are connected between the power ground terminal and the summed output node N4 and their gates are respectively connected to the band gap reference circuit. That is, a plurality of compensation NMOS transistors connected to the first type band gap reference circuit 110 and a plurality of compensation NMOS transistors connected to the second type band gap reference circuit 120 may be implemented to generate a summed compensation current.

The first type compensation current and the second type compensation current, which are generated in the PAR circuit 100, are changed depending on the PVT variation. That is, a change due to a PMOS transistor process, an NMOS transistor process or a temperature, a change of a power supply voltage or a change of a power supply voltage noise is reflected. The first type compensation current and the second type compensation current are changed in response to the PVT variation of the same environmental conditions as those of other components included in the PLL circuit 1, for example, transistors included in the current reference current generator 10, the IDAC 20 or the VCO 30.

The PAR circuit 100 adjusts a weight value in consideration of the change in the first type compensation current and the second type compensation current so as to generate a summed compensation current less affected by the changes of the process, the temperature and the voltage, and the reference current generator 10 may generate a reference current $I_{UNIT}$ in accordance with the summed compensation current $I_{PAR}$. That is the PAR circuit 100 may reduce an influence of changes in the process, the temperature, and the voltage may adjusting a weight value based on the change in the first type compensation current and the second type compensation current so as to generate a summed compensation current, which is used by the reference current generator to generate a reference current $I_{UNIT}$. Therefore, the PLL circuit 1 may implement a reliable operation with only a predetermined (or, alternatively, set or desired) IDAC 20 circuit in accordance with the reference current $I_{UNIT}$.

Figure 8:
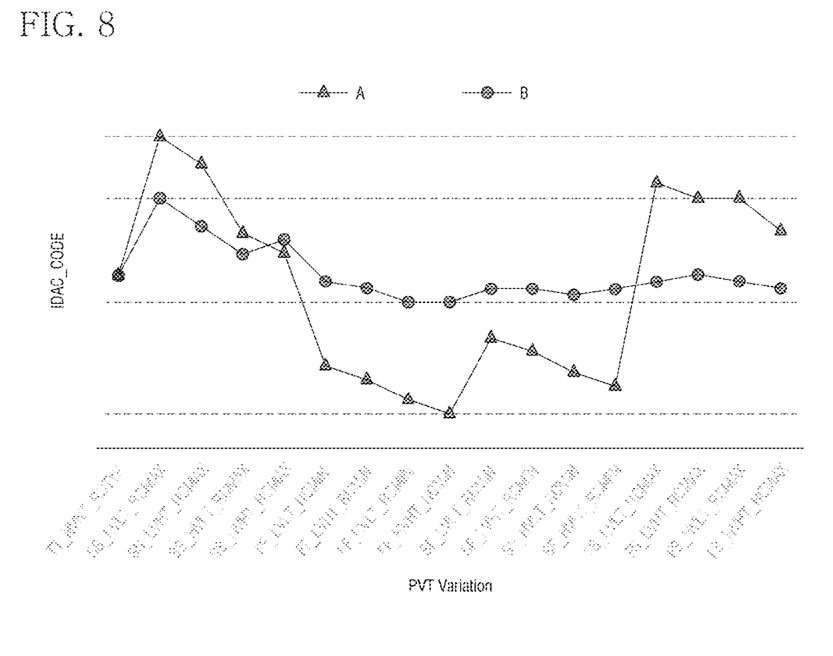
FIG. 8 is a graph illustrating an IDAC_CODE result according to a PVT variation condition when the same frequency is generated between PLL circuits according to a comparative example and some example embodiments.

FIG. 8 is a graph illustrating an IDAC_CODE result according to a PVT variation condition when the same frequency is generated between PLL circuits according to a comparative example and some example embodiments.

Referring to FIG. 8, a horizontal axis represents a PVT variation in consideration of a process condition of a preset range, a voltage change from a low voltage LV to a high voltage HV, a temperature change from a low temperature to a high temperature including a normal temperature, and a change by a passive element.

In case of a comparative example 'A', IDAC_CODE has a severe deviation in accordance with a PVT variation, whereas in case of a PLL circuit 'B' according to some example embodiments, it may be noted that the deviation of IDAC_CODE according to the PVT variation is greatly reduced.

That is, the PLL circuit 1 according to some example embodiments compensates for a process distribution influence, a power supply voltage influence and a temperature change influence by the PAR circuit 100, so that smaller IDAC circuits 20 may be used. In addition, the PLL circuit 1 operates with more reliable performance and may be implemented with a smaller area and a lower cost due to the reduced number of IDAC circuits 20.

The PLL circuit 1 (or other circuitry, for example, PAR circuit 100) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although some example embodiments of the present disclosure have been described with reference to the accompanying drawings, it will be apparent to those skilled in the art that the present disclosure can be embodied in other specific forms without departing from the technical spirits and essential characteristics of the present disclosure. Thus, the above embodiments are to be considered in all respects as illustrative and not restrictive.

What is claimed is:

1. A phase locked loop circuit comprising:
    a reference current generator configured to
        generate a summed compensation current in which at least one of a process change, a temperature change or a power supply voltage change are compensated and
        output the summed compensation current as a reference current;
    a current digital-to-analog converter configured to convert the reference current into a control current in accordance with a digital code; and
    a voltage control oscillator configured to generate a signal based on the control current,
    wherein the summed compensation current is based on weighted-averaging a first type compensation current and a second type compensation current in response to at least one of the process change, the temperature change or the power supply voltage change.

2. The phase locked loop circuit of claim 1, wherein the reference current generator includes a process aware reference (PAR) circuit, the PAR circuit includes a first type band gap reference circuit configured to generate the first type compensation current and a second type band gap reference circuit implemented in a twin structure with the first type band gap reference circuit configured to generate the second type compensation current.

3. The phase locked loop circuit of claim 2, wherein the first type band gap reference circuit includes:
    a first amplifier;
    a pair of first P-Channel Metal-Oxide-Semiconductor (PMOS) transistors connected between a power supply terminal and input terminals of the first amplifier and diode-connected, respectively; and
    a pair of first N-Channel Metal-Oxide-Semiconductor (NMOS) transistors having a gate connected to an output terminal of the first amplifier, connected between the input terminals of the first amplifier and a power ground terminal.

4. The phase locked loop circuit of claim 3, wherein a first PMOS transistor of the pair of first PMOS transistors has a size greater than a second PMOS transistor of the pair of first PMOS transistors.

5. The phase locked loop circuit of claim 3, wherein the first type band gap reference circuit includes:
    a first resistor connected between the power supply terminal and a first input terminal of the first amplifier;
    a first PMOS transistor of the pair of first PMOS transistors and the first resistor connected in series between the power supply terminal and the first input terminal of the first amplifier and diode-connected;
    a second PMOS transistor of the pair of first PMOS transistors connected between the power supply terminal and a second input terminal of the first amplifier and diode-connected;
    a first NMOS transistor of the pair of first PMOS transistors connected between the first input terminal of the first amplifier and the power ground terminal, having a gate terminal connected to the output terminal of the first amplifier; and
    a second NMOS transistor of the pair of first PMOS transistors connected between the second input terminal of the first amplifier and the power ground terminal, having a gate terminal connected to the output terminal of the first amplifier.

6. The phase locked loop circuit of claim 2, wherein the reference current generator includes a weighted current mirror,
    the weighted current mirror is configured to
        weigh the first type compensation current through a first gain, and
        weigh the second type compensation current through a second gain, and
        sum the weighted first type compensation current and the weighted second type compensation current to output the summed compensation current as the reference current.

7. The phase locked loop circuit of claim 6, wherein the weighted current mirror includes:
    a sub-current mirror configured to convert the first type compensation current;
    a plurality of first compensation transistors having a gate configured to receive a first compensation voltage based on the converted first type compensation current; and
    a plurality of second compensation transistors having a gate configured to receive a second compensation voltage based on the second type compensation current, and
    at least one of the plurality of first compensation transistors is configured to be activated in response to the first gain and at least one of the plurality of second compensation transistors is configured to be activated in response to the second gain, so that the reference current is generated.

8. A phase locked loop circuit comprising:
    a pair of band gap reference circuits configured to generate a first type compensation current and a second type compensation current based on a change of at least one of a process, a voltage or a temperature;
    a weighted current mirror configured to generate a summed compensation current by weighted-averaging the first type compensation current and the second type compensation current in response to the change of at least one of the process, the voltage or the temperature;
    a current mirror configured to generate a reference current from the summed compensation current;
    a current analog-to-digital converter configured to generate a control current from the reference current in accordance with a digital code; and a voltage control oscillator configured to generate a signal in accordance with the control current.

9. The phase locked loop circuit of claim 8, wherein the pair of band gap reference circuits include two band gap reference circuits implemented in a twin structure, and being configured to generate the first type compensation current and the second type compensation current, respectively.

10. The phase locked loop circuit of claim 8, wherein
a first type band gap reference circuit of the pair of band gap reference circuits includes:
 a first amplifier;
 a pair of first P-Channel Metal-Oxide-Semiconductor (PMOS) transistors connected between a power supply terminal and input terminals of the first amplifier and respectively diode-connected;
 a pair of first N-Channel Metal-Oxide-Semiconductor (NMOS) transistors having a gate connected to an output terminal of the first amplifier, connected between the input terminals of the first amplifier and a power ground terminal;
 a first resistor connected between the power supply terminal and a first input terminal of the first amplifier; and
 a second resistor connected between any one of the pair of first PMOS transistors and the first input terminal of the first amplifier, and
the first type band gap reference circuit is configured to generate the first type compensation current between a second input terminal of the first amplifier and a drain terminal of any one of the pair of first NMOS transistors.

11. The phase locked loop circuit of claim 10, wherein a first PMOS transistor of the pair of first PMOS transistors, which is connected between the second resistor and the first input terminal of the first amplifier has a different size than a second PMOS transistor of the pair of first PMOS transistors, which is connected between the power supply terminal and the second input terminal of the first amplifier.

12. The phase locked loop circuit of claim 10, wherein
a second type band gap reference circuit of the pair of band gap reference circuits includes:
 a second amplifier;
 a pair of second NMOS transistors connected between the power ground terminal and the input terminals of the second amplifier and respectively diode-connected;
 a pair of second PMOS transistors connected between the input terminals of the second amplifier and the power supply terminal, having a gate connected to an output terminal of the second amplifier;
 a third resistor connected between the power ground terminal and a first input terminal of the second amplifier; and
 a fourth resistor connected between any one of the pair of second NMOS transistors and the first input terminal of the second amplifier, and
the second type band gap reference circuit is configured to generate the second type compensation current between a second input terminal of the second amplifier and a drain terminal of any one of the pair of second PMOS transistors.

13. The phase locked loop circuit of claim 12, wherein a first NMOS transistor of the pair of second NMOS transistors, which is connected between the fourth resistor and the first input terminal of the second amplifier has a different size than a second NMOS transistor of the pair of second NMOS transistors, which is connected between the power ground terminal and the second input terminal of the second amplifier.

14. The phase locked loop circuit of claim 12, wherein the weighted current mirror includes:
 a third NMOS transistor having a gate terminal connected to the output terminal of the first amplifier and a source terminal connected to the power ground terminal;
 a third PMOS transistor connected between a drain terminal of the third NMOS transistor and the power supply terminal and diode-connected;
 a plurality of first compensation transistors having a gate terminal connected to a gate of the third PMOS transistor and a drain terminal connected to a summed output node; and
 a plurality of second compensation transistors having a gate terminal connected to the output terminal of the second amplifier and a drain terminal connected to the summed output node, and
the weighted current mirror is configured to output the summed compensation current to the summed output node by activating at least one of the plurality of first compensation transistors and at least one of the plurality of second compensation transistors in response to the change of at least one of the process, the voltage or the temperature.

15. A semiconductor device comprising:
 a first type band gap reference circuit configured to generate a first type compensation current based on change of at least one of a process, a voltage or a temperature;
 a second type band gap reference circuit having a twin structure with the first type band gap reference circuit and configured to generate a second type compensation current based on the change of at least one of the process, the voltage or the temperature;
 a plurality of first compensation transistors in which at least one is configured to output a weighted first type compensation current in response to the change of at least one of the process, the voltage or the temperature; and
 a plurality of second compensation transistors in which at least one is configured to output a weighted second type compensation current in response to the change of at least one of the process, the voltage or the temperature, and
wherein the semiconductor device is configured to generate a summed compensation current obtained by weighted-averaging the first type compensation current and the second type compensation current through a common node of the plurality of first compensation transistors and the plurality of second compensation transistors.

16. The semiconductor device of claim 15, wherein
the first type band gap reference circuit includes:
 a first amplifier;
 a pair of first P-Channel Metal-Oxide-Semiconductor (PMOS) transistors connected between a power supply terminal and input terminals of the first amplifier and respectively diode-connected;
 a pair of first N-Channel Metal-Oxide-Semiconductor (NMOS) transistors having a gate connected to an output terminal of the first amplifier and connected between the input terminals of the first amplifier and a power ground terminal;

a first resistor connected between the power supply terminal and a first input terminal of the first amplifier; and a second resistor connected between any one of the pair of first PMOS transistors and the first input terminal of the first amplifier, and the first type band gap reference circuit is configured to generate the first type compensation current between a second input terminal of the first amplifier and a drain terminal of any one of the pair of first NMOS transistors.

17. The semiconductor device of claim 15, wherein the second type band gap reference circuit includes:

a second amplifier;

a pair of second NMOS transistors connected between a power ground terminal and input terminals of the second amplifier and respectively diode-connected;

a pair of second PMOS transistors having a gate connected to an output terminal of the second amplifier, connected between the input terminals of the second amplifier and a power supply terminal;

a third resistor connected between the power ground terminal and a first input terminal of the second amplifier; and a fourth resistor connected between any one of the pair of second NMOS transistors and the first input terminal of the second amplifier, and wherein the second type band gap reference circuit is configured to generate the second type compensation current between a second input terminal of the second amplifier and a drain terminal of any one of the pair of second PMOS transistors.

18. The semiconductor device of claim 16, wherein the pair of first PMOS transistors and the pair of second NMOS transistors have a pair of different-sized transistors, respectively.

19. The semiconductor device of claim 15, further comprising:

a current mirror configured to generate a reference current from the summed compensation current;

a current analog-to-digital converter configured to generate a control current from the reference current in accordance with a digital code; and a voltage control oscillator configured to generate a signal in accordance with the control current.

20. The semiconductor device of claim 19, wherein the semiconductor device configured to adjust a weight value in response to a change of at least one of a process, a voltage or a temperature of a transistor included in the current mirror and the current analog-to-digital converter, and generate the summed compensation current obtained by weighted-averaging the first type compensation current and the second type compensation current in accordance with the weight value.

* * * * *